(12) United States Patent
Yamashita

(10) Patent No.: US 9,874,594 B2
(45) Date of Patent: Jan. 23, 2018

(54) CIRCUIT BOARD INSPECTING APPARATUS AND CIRCUIT BOARD INSPECTING METHOD

(71) Applicant: NIDEC-READ CORPORATION, Kyoto (JP)

(72) Inventor: Munehiro Yamashita, Kyoto (JP)

(73) Assignee: NIDEC-READ CORPORATION, Kyoto (JP)

( * ) Notice: Subject to any disclaimer, the term of this patent is extended or adjusted under 35 U.S.C. 154(b) by 217 days.

(21) Appl. No.: 14/726,660

(22) Filed: Jun. 1, 2015

(65) Prior Publication Data
US 2015/0346268 A1 Dec. 3, 2015

(30) Foreign Application Priority Data

Jun. 2, 2014 (JP) .................................. 2014-113969

(51) Int. Cl.
| | |
|---|---|
| G01R 31/14 | (2006.01) |
| G01R 31/28 | (2006.01) |
| G01R 31/12 | (2006.01) |
| G01R 27/26 | (2006.01) |
| G01R 31/02 | (2006.01) |
| H04L 12/24 | (2006.01) |

(52) U.S. Cl.
CPC ..... *G01R 31/1272* (2013.01); *G01R 27/2617* (2013.01); *G01R 31/28* (2013.01); *G01R 31/2812* (2013.01); *G01R 31/021* (2013.01); *G01R 31/12* (2013.01); *H04L 41/0677* (2013.01)

(58) Field of Classification Search
CPC ............ G01R 27/2617; G01R 31/1272; G01R 31/016; G01R 31/028; G01R 31/021; G01R 31/12; H04L 41/0677
USPC ......... 324/71, 378, 403, 415, 425, 500, 509, 324/537, 541, 544, 548, 551, 557
See application file for complete search history.

(56) References Cited

U.S. PATENT DOCUMENTS

2005/0200363 A1* 9/2005 Hasegawa .......... G01R 31/2805
    324/523
2006/0055413 A1* 3/2006 Yamaoka ........... G01R 31/2808
    324/530

(Continued)

FOREIGN PATENT DOCUMENTS

JP H06-230058 A 8/1994

*Primary Examiner* — Huy Q Phan
*Assistant Examiner* — Raul Rios Russo
(74) *Attorney, Agent, or Firm* — Viering, Jentschura & Partner mbB

(57) ABSTRACT

A circuit board inspecting apparatus is disclosed for inspecting a circuit board having wiring patterns separated from each other and forming a plurality of wiring pattern pairs. The apparatus includes a low-voltage inspection part to apply a first low-potential difference below a threshold voltage between wiring patterns in a first of the plurality of wiring pattern pairs, and to detect a first current flowing therebetween. A resistance measurement part is provided to measure a first resistance value between the wiring patterns of the first wiring pattern pair upon detection of the first current and a high-voltage inspection part is configured to selectively apply, based on the first resistance value, a high-potential difference above said threshold voltage, between the wiring patterns in a second of said plurality of wiring pattern pairs.

20 Claims, 7 Drawing Sheets

(56) References Cited

U.S. PATENT DOCUMENTS

| | | | |
|---|---|---|---|
| 2006/0175607 A1* | 8/2006 | Matsumiya | H01L 22/34 257/48 |
| 2012/0032700 A1* | 2/2012 | Sugane | G01R 31/2812 324/763.01 |
| 2012/0127684 A1* | 5/2012 | Matsumoto | H01L 23/142 361/783 |
| 2015/0084643 A1* | 3/2015 | Yamashita | G01R 31/024 324/551 |

* cited by examiner

CIRCUIT BOARD INSPECTING APPARATUS AND CIRCUIT BOARD INSPECTING METHOD

CROSS REFERENCE TO RELATED APPLICATION

This application is based on and claims priority from Japanese Patent Application No. 2014-113969, filed on Jun. 2, 2014, the contents of which are hereby incorporated by reference in their entirety.

BACKGROUND

Technical Field

This disclosure relates to a circuit board inspecting apparatus and a circuit board inspecting method for conducting an inspection on a circuit board.

Related Art

A circuit board having a plurality of wiring patterns formed thereon has been subjected to an insulation inspection (a leak inspection) as to whether or not the respective wiring patterns are correctly insulated from one another. The insulation inspection involves applying a voltage between wiring patterns to be inspected, and detecting a current flowing between the wiring patterns. However, if an insulation failure occurs between the wiring patterns, the current flows through a portion where the insulation failure occurs, at the time when the voltage for use in the insulation inspection is applied between the wiring patterns. As a result, heat is generated to cause burnout of the portion where the insulation failure occurs.

In view of this circumstance, a known technique involves: applying, between wiring patterns, a low voltage which does not cause burnout of a portion where an insulation failure occurs; applying a high voltage between wiring patterns between which no current flows in the insulation inspection using the low voltage; and determining the wiring patterns between which no current flows in the insulation inspection using the high voltage, as wiring patterns between which no insulation failure occurs (i.e., as wiring patterns which are favorably insulated from each other) (refer to, for example, JP 06-230058 A).

However, the inventors have newly found that the inspecting method disclosed in JP 06-230058 A erroneously determines wiring patterns between which an insulation failure occurs, as wiring patterns which are favorably insulated from each other (i.e., the inspecting method is incapable of detecting an insulation failure).

SUMMARY

An exemplary embodiment of the disclosure provides a circuit board inspecting apparatus and a circuit board inspecting method each capable of improving the accuracy of an insulation inspection.

An exemplary embodiment of the disclosure provides a circuit board inspecting apparatus for inspecting insulation among three or more wiring patterns disposed on a circuit board so as to be spaced apart from one another. The circuit board inspecting apparatus includes: a low-voltage inspection part configured to conduct a low-voltage insulation inspection that involves causing a potential difference between the adjacent wiring patterns defined as a wiring pattern pair among the three or more wiring patterns, and determining whether or not an insulation failure occurs between the wiring patterns of each wiring pattern pair, based on a current flowing between the wiring patterns of each wiring pattern pair; a resistance measurement part configured to execute a resistance measurement process that involves measuring a resistance value between the wiring patterns of the wiring pattern pair determined in the low-voltage insulation inspection that the insulation failure occurs; and a high-voltage inspection part configured to conduct a high-voltage insulation inspection that involves causing a potential difference, which is larger than the potential difference caused in the low-voltage insulation inspection, between the wiring patterns of the different wiring pattern pair including one of the wiring patterns of the wiring pattern pair having the measured resistance value falling below a preset reference value in the resistance measurement process, the different wiring pattern pair determined in the low-voltage insulation inspection that no insulation failure occurs, and determining whether or not an insulation failure occurs between the wiring patterns of the different wiring pattern pair, based on a current flowing between the wiring patterns of the different wiring pattern pair.

An exemplary embodiment of the disclosure provides a circuit board inspecting method for inspecting insulation among three or more wiring patterns disposed on a circuit board so as to be spaced apart from one another. The circuit board inspecting method includes: a low-voltage inspection step of conducting a low-voltage insulation inspection that involves causing a potential difference between the adjacent wiring patterns defined as a wiring pattern pair among the three or more wiring patterns, and determining whether or not an insulation failure occurs between the wiring patterns of each wiring pattern pair, based on a current flowing between the wiring patterns of each wiring pattern pair; a resistance measurement step of executing a resistance measurement process that involves measuring a resistance value between the wiring patterns of the wiring pattern pair determined in the low-voltage insulation inspection that the insulation failure occurs; and a high-voltage inspection step of conducting a high-voltage insulation inspection that involves causing a potential difference, which is larger than the potential difference caused in the low-voltage insulation inspection, between the wiring patterns of the different wiring pattern pair including one of the wiring patterns of the wiring pattern pair having the measured resistance value falling below a preset reference value in the resistance measurement process, the different wiring pattern pair determined in the low-voltage insulation inspection that no insulation failure occurs, and determining whether or not an insulation failure occurs between the wiring patterns of the different wiring pattern pair, based on a current flowing between the wiring patterns of the different wiring pattern pair.

The inventors have found the following fact. In a case where an insulation failure occurs between wiring patterns of a different pair including one of wiring patterns of a wiring pattern pair to be inspected, that is, wiring patterns of a wiring pattern pair adjacent to a wiring pattern pair to be inspected, occasionally, it is impossible to detect an insulation failure occurring between the wiring patterns of the wiring pattern pair to be inspected, because of an influence of the insulation failure occurring between the wiring patterns of the different wiring pattern pair. The inventors have also found the following fact. In a case where an insulation failure occurring between wiring patterns of a wiring pattern pair adjacent to a wiring pattern pair to be inspected is a low-resistance insulation failure having a resistance value falling below a predetermined reference value, it is possible to detect an insulation failure occurring between wiring patterns of a wiring pattern pair adjacent to the wiring pattern pair at which the low-resistance insulation failure occurs.

In view of these facts, according to this configuration, upon conduction of the insulation inspection among the three or more wiring patterns disposed on the circuit board so as to be spaced apart from one another, the low-voltage inspection part conducts the low-voltage insulation inspection of causing the potential difference between the adjacent wiring patterns of the wiring pattern pair. Then the resistance measurement part measures the resistance value between the wiring patterns of the wiring pattern pair determined in the low-voltage insulation inspection that the insulation failure occurs. If the measured resistance value falls below the predetermined reference value, the high-voltage inspection part conducts the high-voltage insulation inspection of causing the potential difference, which is larger than the potential difference caused in the low-voltage insulation inspection, between the wiring patterns of the different wiring pattern pair adjacent to the wiring pattern pair having such a resistance value, the different wiring pattern pair determined in the low-voltage insulation inspection that no insulation failure occurs.

According to this configuration, even in a case where an insulation failure occurs between wiring patterns of a wiring pattern pair adjacent to a wiring pattern pair to be inspected, when the insulation failure has a low resistance value and an insulation failure occurring between the wiring patterns of the wiring pattern pair to be inspected can be detected, the high-voltage insulation inspection is conducted to determine whether or not the insulation failure occurs between the wiring patterns of the wiring pattern pair to be inspected. Therefore, it is possible to reduce a possibility that wiring patterns between which an insulation failure occurs are erroneously determined as wiring patterns which are favorably insulated from each other. Thus, it is possible to improve the accuracy of the insulation inspection.

Preferably, the high-voltage inspection part prohibits conduction of the high-voltage insulation inspection on the different wiring pattern pair including one of the wiring patterns of the wiring pattern pair having the measured resistance value exceeding the reference value in the resistance measurement process.

The inventors have found the following fact. In a case of conducting a high-voltage insulation inspection on wiring patterns of a different wiring pattern pair including one of wiring patterns of a wiring pattern pair having a measured resistance value exceeding a reference value in a resistance measurement process, that is, wiring patterns of a wiring pattern pair adjacent to a wiring pattern pair at which an insulation failure having a resistance value exceeding a reference value occurs, potentially, it is impossible to detect an insulation failure occurring between wiring patterns of a wiring pattern pair to be inspected. In view of this fact, according to this configuration, the high-voltage insulation inspection is not conducted on the wiring pattern pair adjacent to the wiring pattern pair at which the insulation failure having the resistance value exceeding the reference value occurs. Therefore, it is possible to avoid conduction of a high-voltage insulation inspection which is low in reliability. As a result, it is possible to improve the accuracy of the insulation inspection.

Preferably, the high-voltage inspection part prohibits conduction of the high-voltage insulation inspection on the wiring pattern pair determined in the low-voltage insulation inspection that the insulation failure occurs.

According to this configuration, the high-voltage inspection part does not conduct the high-voltage insulation inspection on the wiring pattern pair determined in the low-voltage insulation inspection that the insulation failure occurs. As a result, the portion where the insulation failure occurs is not applied with a high voltage. Therefore, it is possible to avoid burnout of the portion where the insulation failure occurs, due to the high voltage.

Preferably, the circuit board inspecting apparatus further includes first and second probes to be brought into contact with two positions on the wiring pattern, the first and second probes provided in plural sets in correspondence with the respective wiring patterns. In the resistance measurement process, preferably, the resistance measurement part feeds a current between the first probe brought into contact with the first wiring pattern of the wiring pattern pair to be inspected and the first probe brought into contact with the second wiring pattern of the wiring pattern pair, detects a voltage between the second probe brought into contact with the first wiring pattern and the second probe brought into contact with the second wiring pattern, and calculates a resistance value between the first and second wiring patterns of the wiring pattern pair to be inspected, based on the detected voltage.

According to this configuration, the two probes are brought into contact with one of the wiring patterns of the wiring pattern pair to be subjected to the measurement of a resistance between the wiring patterns, and the two probes are brought into contact with the other wiring pattern of the wiring pattern pair. The probe which is different from the probe configured to feed a current between the wiring patterns detects a voltage between the wiring patterns. Therefore, it is possible to accurately measure the resistance by a so-called four-terminal measurement method. Accordingly, it is possible to improve the accuracy of resistance measurement in the resistance measurement process. As a result, it is possible to improve the accuracy of determination as to whether or not each wiring pattern pair is subjected to the high-voltage insulation inspection. Therefore, it is possible to improve the accuracy of the insulation inspection.

Preferably, the potential difference caused in the low-voltage insulation inspection is set at a voltage causing no burnout of a failure portion corresponding to a linear conductor formed to connect between the adjacent wiring patterns or a failure portion corresponding to a plurality of conductor particles distributed between the adjacent wiring patterns.

According to this configuration, it is possible to reduce a risk of burnout of the failure portion corresponding to the linear conductor formed to connect between the wiring patterns of the wiring pattern pair to be inspected or the failure portion corresponding to the plurality of conductor particles distributed between the wiring patterns of the wiring pattern pair, upon conduction of the insulation inspection.

Preferably, the potential difference caused in the low-voltage insulation inspection is set at lower one of a voltage generated when a predetermined current from 0.1 mA to 2 mA flows through the failure portion and a predetermined voltage from 0.2 V to 20 V.

The potential difference caused in the low-voltage insulation inspection is set at lower one of the voltage generated when the predetermined current from 0.1 mA to 2 mA flows through the failure portion and the predetermined voltage from 0.2 V to 20 V. Thus, it is possible to reduce a risk of burnout of the failure portion corresponding to the linear conductor formed to connect between the wiring patterns of the wiring pattern pair to be inspected or the failure portion corresponding to the plurality of conductor particles distributed between the wiring patterns of the wiring pattern pair, upon conduction of the insulation inspection.

Preferably, the potential difference caused in the high-voltage insulation inspection is set at a voltage that causes sparking between the wiring patterns of the wiring pattern pair when a failure occurs at the wiring pattern pair so as to narrow a length between the wiring patterns of the wiring pattern pair.

According to this configuration, in a case where an insulation failure occurs between wiring patterns spaced apart from each other and narrows a length between the wiring patterns although not establishing continuity between the wiring patterns, it is possible to detect the insulation failure in such a manner as to cause sparking between the wiring patterns in the high-voltage insulation inspection.

Preferably, the potential difference caused in the high-voltage insulation inspection is set at lower one of a voltage generated when a predetermined current exceeding 2 mA flows through the failure portion and a predetermined voltage exceeding 20 V.

The potential difference caused in the high-voltage insulation inspection is set at lower one of the voltage generated when the predetermined current exceeding 2 mA flows through the failure portion and the predetermined voltage exceeding 20 V. Thus, it is possible to detect the failure portion which narrows the length between the wiring patterns of the wiring pattern pair, in the high-voltage insulation inspection.

Preferably, the reference value is set to distinguish a failure portion corresponding to a linear conductor formed to connect between the adjacent wiring patterns, from a failure portion corresponding to a plurality of conductor particles distributed between the adjacent wiring patterns.

The inventors have found the following fact. In a case where an insulation failure corresponding to a linear conductor formed to connect between adjacent wiring patterns occurs between wiring patterns of a wiring pattern pair adjacent to a wiring pattern pair to be inspected, it is possible to detect an insulation failure occurring between wiring patterns of a wiring pattern pair adjacent to the wiring pattern pair at which the insulation failure described above occurs. In view of this fact, according to this configuration, when the insulation failure corresponding to the linear conductor formed to connect between the wiring patterns of the wiring pattern pair occurs at the wiring pattern pair adjacent to the wiring pattern pair to be inspected, the high-voltage inspection part conducts the high-voltage insulation inspection of determining whether or not an insulation failure occurs at the wiring pattern pair to be inspected. Therefore, it is possible to reduce a possibility that wiring patterns between which an insulation failure occurs are erroneously determined as wiring patterns which are favorably insulated from each other. Thus, it is possible to improve the accuracy of the insulation inspection.

Preferably, the reference value is substantially 25Ω.

The value of substantially 25Ω is suitable as a reference value for distinguishing the failure portion corresponding to the linear conductor formed to connect between the adjacent wiring patterns, from the failure portion corresponding to the plurality of conductor particles distributed between the adjacent wiring patterns.

Preferably, the circuit board inspecting apparatus further includes a failure cause estimation part configured to estimate occurrence of a failure portion corresponding to a linear conductor formed to connect between the wiring patterns of the wiring pattern pair, between the wiring patterns of the wiring pattern pair having the measured resistance value falling below the reference value in the resistance measurement process.

According to this configuration, when the resistance value between the wiring patterns of the wiring pattern pair falls below the reference value, the failure cause estimation part estimates the occurrence of the failure portion corresponding to the linear conductor formed to connect between the wiring patterns of the wiring pattern pair, between the wiring patterns of the wiring pattern pair. Therefore, it is possible to grasp a specific state of the insulation failure.

Preferably, the circuit board inspecting apparatus further includes a failure cause estimation part configured to estimate occurrence of a failure portion corresponding to a plurality of conductor particles distributed between the wiring patterns of the wiring pattern pair, between the wiring patterns of the wiring pattern pair having the measured resistance value exceeding the reference value in the resistance measurement process.

According to this configuration, when the resistance value between the wiring patterns of the wiring pattern pair exceeds the reference value, the failure cause estimation part estimates the occurrence of the failure portion corresponding to the plurality of conductor particles distributed between the wiring patterns of the wiring pattern pair, between the wiring patterns of the wiring pattern pair. Therefore, it is possible to grasp a specific state of the insulation failure.

Preferably, the circuit board inspecting apparatus further includes a failure cause estimation part configured to estimate occurrence of a failure portion formed to narrow a length between the wiring patterns of the wiring pattern pair, between the wiring patterns of the wiring pattern pair determined in the high-voltage insulation inspection that the insulation failure occurs.

According to this configuration, when the high-voltage inspection part determines in the high-voltage insulation inspection that the insulation failure occurs between the wiring patterns of the wiring pattern pair, the failure cause estimation part estimates the occurrence of the failure portion formed to narrow the length between the wiring patterns of the wiring pattern pair, between the wiring patterns of the wiring pattern pair. Therefore, it is possible to grasp a specific state of the insulation failure.

The circuit board inspecting apparatus and the circuit board inspecting method each configured as described above are capable of improving the accuracy of an insulation inspection.

The foregoing and other objects, features, aspects, and advantages of the disclosed invention will become more apparent from the following detailed description, when taken in conjunction with the accompanying drawings.

DETAILED DESCRIPTION

Figure 1:
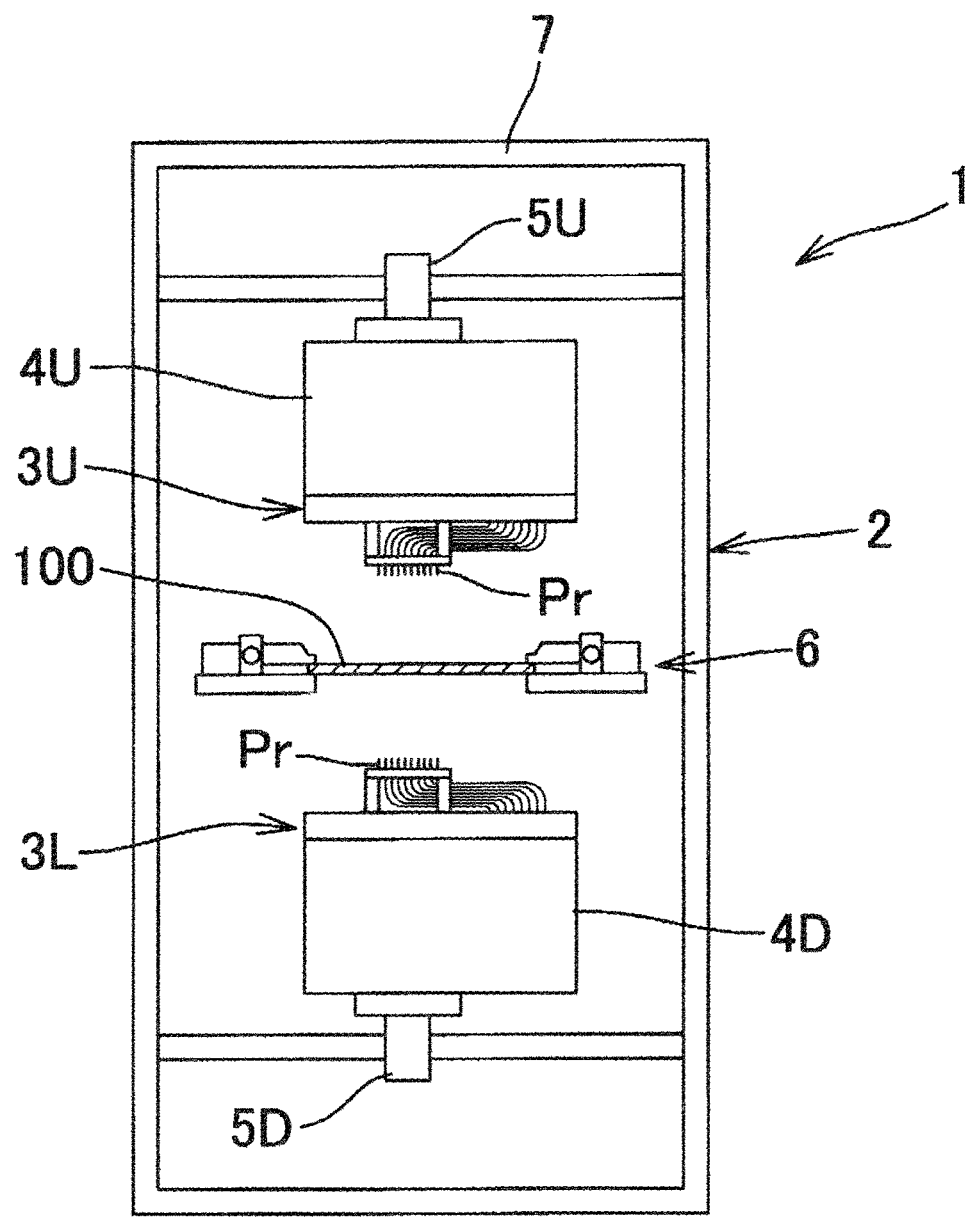
FIG. 1 is a front view schematically illustrating a configuration of a circuit board inspecting apparatus.

An exemplary embodiment of the disclosure will be described below with reference to the drawings. In the respective drawings, constituent elements denoted with the same reference signs are equal in configuration to one another; therefore, the repetitive description thereof will not be given here. FIG. 1 is a front view schematically illustrating a configuration of a circuit board inspecting apparatus according to an exemplary embodiment of the disclosure. The circuit board inspecting apparatus 1 illustrated in FIG. 1 is configured to inspect a circuit pattern formed on a circuit board 100 to be inspected.

The circuit board 100 corresponds to, for example, a printed wiring board. Examples of the circuit board 100 may include various circuit boards such as a flexible circuit board, a ceramic multilayer wiring board, an electrode plate for use in a liquid crystal display or a plasma display, and a package substrate or a film carrier for use in a semiconductor package.

As illustrated in FIG. 1, the circuit board inspecting apparatus 1 includes a main body 2, and inspecting jigs 3U and 3D. The main body 2 mainly includes inspection parts 4U and 4D, inspection part movement mechanisms 5U and 5D, a circuit board fixing device 6, and a housing 7 for accommodating these constituent elements. The circuit board fixing device 6 is configured to fix the circuit board 100 to be inspected, at a predetermined position. The inspection part movement mechanisms 5U and 5D appropriately move the inspection parts 4U and 4D within the housing 7, respectively.

The inspection part 4U is disposed above the circuit board 100 fixed by the circuit board fixing device 6. The inspection part 4D is disposed below the circuit board 100 fixed by the circuit board fixing device 6. The inspection parts 4U and 4D have the inspecting jigs 3U and 3D attachable thereto and detachable therefrom. The inspecting jigs 3U and 3D are configured to inspect the circuit pattern formed on the circuit board 100.

Each of the inspecting jigs 3U and 3D has a plurality of probes Pr attached thereto. Each of the probes Pr is made of metals with high toughness, such as tungsten (W), high-speed steel (HSS), and beryllium copper (BeCu), and other conductors. Moreover, each of the probes Pr is formed into a bendable wire shape (rod shape) with elasticity (flexibility). Each of the probes Pr has a diameter set at, for example, about 100 μm.

The probes Pr are disposed in correspondence with inspection points defined on wiring patterns disposed on both surfaces on the circuit board 100 to be inspected, respectively. Thus, the probes Pr of the inspecting jig 3U are brought into contact with the inspection points defined on the upper surface of the circuit board 100, respectively. On the other hand, the probes Pr of the inspecting jig 3D are brought into contact with the inspection points defined on the lower surface of the circuit board 100, respectively.

Figure 2A:
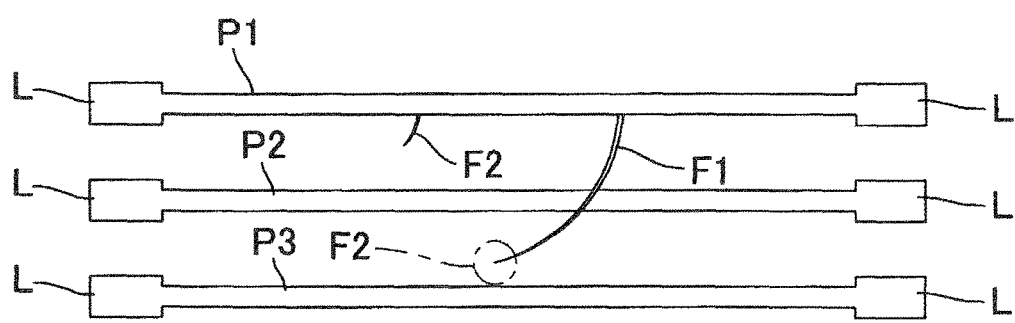
FIGS. 2A and 2B each illustrate a state of a failure occurring at a wiring pattern formed on a surface of a circuit board to be inspected.
Figure 2B:
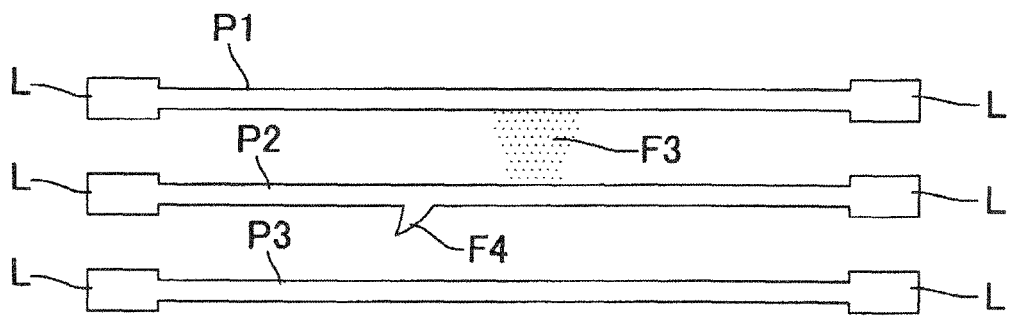

FIGS. 2A and 2B each illustrate a state of an insulation failure occurring at the wiring pattern formed on the surface of the circuit board 100 to be inspected. It is assumed in FIGS. 2A and 2B that three wiring patterns P1, P2, and P3 are formed in parallel on the surface of the circuit board 100 so as to be spaced apart from one another. Each of the wiring patterns P1, P2, and P3 has pads L formed on both ends thereof, and electronic components such as an IC (Integrated Circuit), a resistor, and a capacitor are soldered to these pads L. The pads L are suitable as the inspection points to be brought into contact with the probes Pr upon conduction of an inspection.

FIG. 2A illustrates a failure due to a narrow-linear conductor formed to connect between the wiring patterns P1 and P2 (hereinafter, such a failure will be referred to as a "hair-like short-circuit failure F1"). FIG. 2A also illustrates a failure due to a narrow-linear conductor formed to extend from the wiring pattern P1 toward the wiring pattern P2 (hereinafter, such a failure will be referred to as a "narrow line failure F2"). In a process of manufacturing the circuit board 100, occasionally, the wiring patterns P1, P2, and P3 are formed by etching on the surface of the circuit board 100, and then the surface of the circuit board 100 is polished. When the wiring patterns P1, P2, and P3 on the surface of the circuit board 100 are polished, occasionally, splinters are formed on edges of the wiring patterns P1, P2, and P3.

The splinter formed on the wiring pattern P1 as described above reaches the wiring pattern P2 adjacent to the wiring pattern P1, and comes into contact with the wiring pattern P2, thereby causing the hair-like short-circuit failure F1. The hair-like short-circuit failure F1 establishes continuity between the wiring patterns P1 and P2. A resistance due to the hair-like short-circuit failure F1 (i.e., a resistance value Rx between the wiring patterns P1 and P2) is frequently not more than about 25Ω. The narrow-linear conductor that causes the hair-like short-circuit failure F1 has a thickness on the order of micrometers. When an inspection voltage of about 250 V, which is typically used for an insulation inspection, is applied to the narrow-linear conductor, a large current flows through the narrow-linear conductor. This current potentially results in burnout of the narrow-linear conductor.

On the other hand, when the splinter formed on the wiring pattern P1 as described above does not reach the wiring pattern P2 adjacent to the wiring pattern P1, the splinter causes the narrow line failure F2. The narrow line failure F2 shortens an insulation length between the wiring patterns P1 and P2 and reduces an insulation withstand voltage between the wiring patterns P1 and P2 since a leading end of a portion where the narrow line failure F2 occurs approaches the wiring pattern P2. In this case, when a high voltage is applied between the wiring patterns P1 and P2, sparking potentially occurs between the wiring pattern P2 and the leading end of the portion where the narrow line failure F2 occurs.

FIG. 2B illustrates a failure due to a plurality of conductor particles distributed between the wiring patterns P1 and P2 (hereinafter, such a failure will be referred to as a "particle failure F3"). FIG. 2B also illustrates a failure due to a protrusion formed on the wiring pattern P2 so as to extend toward the wiring pattern P3 (hereinafter, such a failure will be referred to as a "protrusion failure F4").

The particle failure F3 is caused by, for example, particle-like chips from the polished wiring patterns P1, P2, and P3 made of, for example, copper. Such particle-like conductors (copper) are distributed between the wiring patterns P1 and P2 to lower the insulation resistance value Rx between the wiring patterns P1 and P2. In the case of the particle failure F3, frequently, the resistance value Rx between the wiring patterns P1 and P2 is about 10 MΩ to 100 MΩ. When an inspection voltage of about 250 V, which is typically used for an insulation inspection, is applied between the wiring patterns P1 and P2 between which the particle failure F3 occurs, the portion where particle failure F3 occurs is potentially burnt out.

The inventors have found the following fact. The particle failure F3 occurring between the wiring patterns P1 and P2 lowers an insulation resistance between the wiring patterns P1 and P2, and causes capacitive coupling between the wiring patterns P1 and P2.

The protrusion failure F4 occurs due to, for example, an etching failure upon formation of the wiring pattern P2. The protrusion failure F4 shortens an insulation length between the wiring patterns P2 and P3 and reduces an insulation withstand voltage between the wiring patterns P2 and P3 since a leading end of a portion where the protrusion failure F4 occurs approaches the wiring pattern P3. In this case, when a high voltage is applied between the wiring patterns P2 and P3, sparking potentially occurs between the wiring pattern P3 and the leading end of the portion where the protrusion failure F4 occurs.

Figure 3:
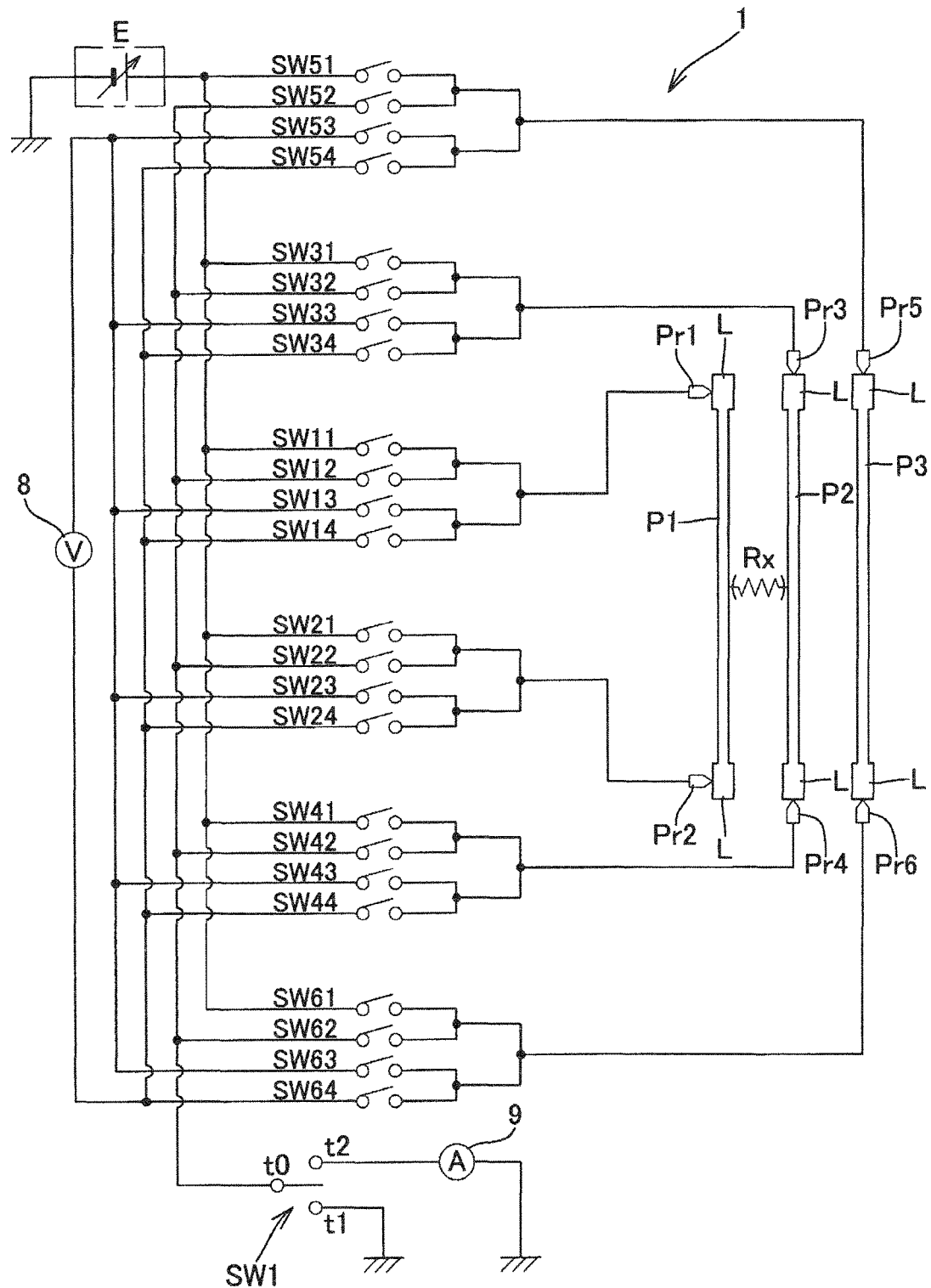
FIG. 3 is a circuit diagram schematically illustrating an electrical configuration of the circuit board inspecting apparatus.
Figure 4:
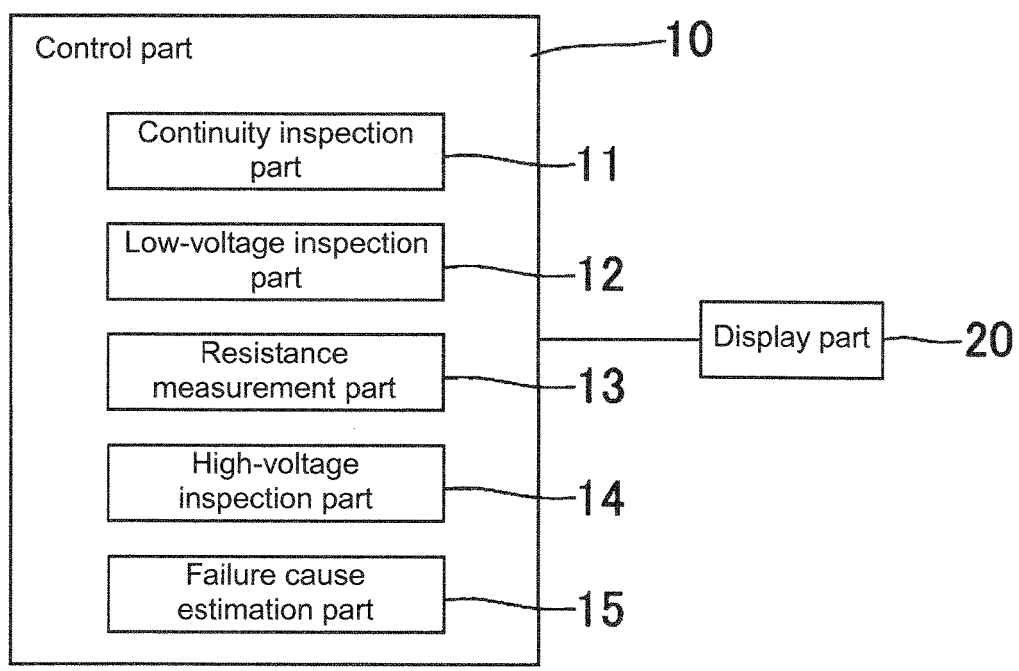
FIG. 4 is a block diagram schematically illustrating the electrical configuration of the circuit board inspecting apparatus.

FIG. 3 and FIG. 4 are a circuit diagram and a block diagram each schematically illustrating an electrical configuration of the circuit board inspecting apparatus 1 according to an exemplary embodiment of the disclosure. In the circuit board inspecting apparatus 1, the plurality of probes Pr includes probes Pr1 to Pr6. Each of the probes Pr1, Pr3, and Pr5 corresponds to a first probe, and each of the probes Pr2, Pr4, and Pr6 corresponds to a second probe. Moreover, the circuit board inspecting apparatus 1 includes a power supply E, a voltage detection part 8, a current detection part 9, a changeover switch SW1, switches SW11 to SW14, switches SW21 to SW24, switches SW31 to SW34, switches SW41 to SW44, switches SW51 to SW54, switches SW61 to SW64, a control part 10, and a display part 20.

In an exemplary embodiment illustrated in FIG. 3, the wiring patterns P1, P2, and P3 are disposed on the surface of the circuit board 100 so as to be spaced apart from one another. The probe Pr1 is in contact with one of the pads L of the wiring pattern P1. The probe Pr2 is in contact with the other pad L of the wiring pattern P1. The probe Pr3 is in contact with one of the pads L of the wiring pattern P2. The probe Pr4 is in contact with the other pad L of the wiring pattern P2. The probe Pr5 is in contact with one of the pads L of the wiring pattern P3. The probe Pr6 is in contact with the other pad L of the wiring pattern P3. In FIG. 3, reference sign Rx represents a resistance value at an insulation failure occurring between the wiring patterns P1 and P2.

Each of the switches SW11 to SW64 corresponds to a toggle switch configured with, for example, a semiconductor switching element such as a transistor, or a relay switch. Each of the switches SW11 to SW64 is closed and opened in accordance with a control signal from the control part 10.

The number of wiring patterns is not limited to three, but is preferably three or more. If the number of wiring patterns is four or more, the probes Pr and switches SW are provided in correspondence with the respective wiring patterns.

The power supply E corresponds to a power supply circuit capable of controlling an output voltage and an output current in accordance with a control signal from the control part 10. The output voltage from the power supply E corresponds to a voltage to be generated between wiring patterns of a wiring pattern pair to be inspected. The power supply E is switchable between, for example, a low-voltage mode and a high-voltage mode, in accordance with a control signal from the control part 10.

Figure 5:
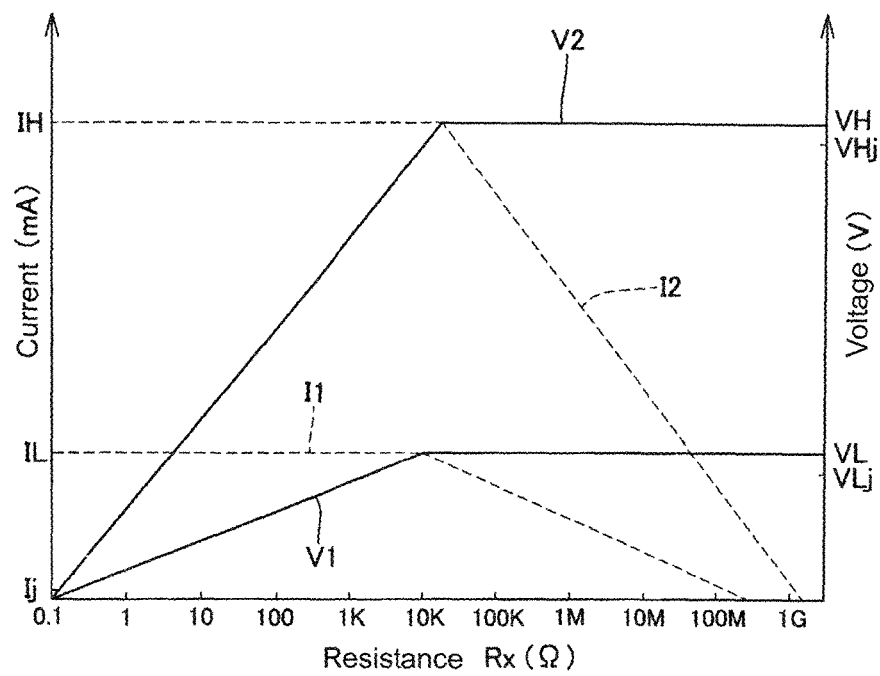
FIG. 5 is a graph illustrating an output characteristic of a power supply illustrated in FIG. 3.

FIG. 5 is a graph illustrating an output characteristic of the power supply E illustrated in FIG. 3. In FIG. 5, the horizontal axis represents a load resistance of the power supply E, that is, a resistance value Rx between wiring patterns of a wiring pattern pair to be inspected. On the other hand, the left longitudinal axis represents an output current from the power supply E, and the right longitudinal axis represents an output voltage from the power supply E. Moreover, an output voltage V1 (shown with a solid line) represents an output voltage from the power supply E in the low-voltage mode, and an output current I1 (shown with a broken line) represents an output current from the power supply E in the low-voltage mode. Furthermore, an output voltage V2 (shown with a solid line) represents an output voltage from the power supply E in the high-voltage mode, and an output current I2 (shown with a broken line) represents an output current from the power supply E in the high-voltage mode.

The power supply E has a function of limiting the output voltage and the output current. In the low-voltage mode, the power supply E limits the output voltage V1 to not more than a preset low-voltage limit value VL. When an insulation failure occurs between wiring patterns to be inspected, and a current flows through a portion where the insulation failure occurs, the power supply E limits the output current I1 flowing through the portion where the insulation failure occurs, to not more than a preset small-current limit value IL. As a result, in the low-voltage mode, when the output voltage V1 is less than the low-voltage limit value VL, the power supply E maintains the output current I1 at the small-current limit value IL. When the output voltage V1 becomes equal to the low-voltage limit value VL, the power supply E adjusts the output current I1 to a current value which is not more than the small-current limit value IL, so as to maintain the output voltage V1 at the low-voltage limit value VL. In the low-voltage mode, thus, the power supply E outputs lower one of a voltage having the low-voltage limit value VL and a voltage generated when a current having the small-current limit value IL flows (into a resistance having a resistance value Rx) between wiring patterns of a wiring pattern pair to be inspected.

On the other hand, in the high-voltage mode, the power supply E limits the output voltage V2 to not more than a preset high-voltage limit value VH. When an insulation failure occurs between wiring patterns to be inspected, and a current flows through a portion where the insulation failure occurs, the power supply E limits the output current I2 flowing through the portion where the insulation failure occurs, to not more than a preset large-current limit value IH. As a result, in the high-voltage mode, when the output voltage V2 is less than the high-voltage limit value VH, the power supply E maintains the output current I2 at the large-current limit value IH. When the output voltage V2 becomes equal to the high-voltage limit value VH, the power supply E adjusts the output current I2 to a current value which is not more than the large-current limit value IH, so as to maintain the output voltage V2 at the high-voltage limit value VH. In the high-voltage mode, thus, the power supply E outputs lower one of a voltage having the high-voltage limit value VH and a voltage generated when a current having the large-current limit value IH flows into the resistance having the resistance value Rx between the wiring patterns of the wiring pattern pair to be inspected.

For example, the low-voltage limit value VL is set at a value which is obtained by experiment and causes no burnout of a portion where the particle failure F3 occurs if the particle failure F3 occurs. For example, the low-voltage limit value VL may be about 0.2 V to 20 V. Preferably, the low-voltage limit value VL may be, for example, 10V.

For example, the small-current limit value IL is set at a value which is obtained by experiment and causes no burnout of the narrow-linear conductor if the hair-like short-circuit failure F1 occurs. For example, the small-current limit value IL may be about 0.1 mA to 2 mA. Preferably, the small-current limit value IL may be, for example, 1 mA.

For example, the high-voltage limit value VH is set to cause sparking if a failure such as the narrow line failure F2 or the protrusion failure F4 occurs to shorten an insulation length between wiring patterns. A voltage having the high-voltage limit value VH may be an inspection voltage for use in, for example, a typical insulation test. For example, the high-voltage limit value VH may be a value which exceeds 20 V and is not more than 1 KV. Preferably, the high-voltage limit value HV may be about 100 V to 500 V. More preferably, the high-voltage limit value HV may be about 250 V.

The large-current limit value IH is set for protecting circuitry in the circuit board inspecting apparatus 1 and the circuit board 100 from damages due to overcurrent. For example, the large-current limit value IH may be a value which exceeds 2 mA and is not more than 1 A. Preferably, the large-current limit value IH may be about 10 mA to 50 mA. More preferably, the large-current limit value IH may be 20 mA. With regard to a case where a current having the small-current limit value IL flows between wiring patterns of a certain wiring pattern pair and a case where a current having the large-current limit value IH flows between the wiring patterns of the same wiring pattern pair, thus, a potential difference caused between the wiring patterns between which the current having the large-current limit value IH flows is made larger than a potential difference caused between the wiring patterns between which the current having the small-current limit value IL flows.

The power supply E has a negative electrode connected to a circuit ground. The power supply E also has a positive electrode connected to one ends of the switches SW11, SW21, SW31, SW41, SW51, and SW61.

The changeover switch SW1 is configured with, for example, a semiconductor switch such as a transistor, or a relay switch. The changeover switch SW1 includes terminals t0, t1, and t2. The changeover switch SW1 switches a terminal to be connected to the terminal t0, between the terminal t1 and the terminal t2 in accordance with a control signal from the control part 10.

The terminal t0 is connected to one ends of the switches SW12, SW22, SW32, SW42, SW52, and SW62. The terminal t1 is connected to the circuit ground. The terminal t2 is connected to the circuit ground via the current detection part 9.

The current detection part 9 corresponds to a current measurement circuit configured with, for example, a shunt resistor or a Hall element. When the terminal t0 is connected to the terminal t2 in the changeover switch SW1, the current detection part 9 detects a current flowing between two probes Pr selected by the switches SW11 to SW64, and then transmits a value of the detected current to the control part 10.

The voltage detection part 8 corresponds to a voltage measurement circuit configured with, for example, an analog-to-digital converter. For example, the voltage detection part 8 has a positive electrode connected to one ends of the switches SW13, SW23, SW33, SW43, SW53, and SW63, and a negative electrode connected to one ends of the switches SW14, SW24, SW34, SW44, SW54, and SW64.

The other ends of the switches SW11, SW12, SW13, and SW14 are connected to the probe Pr1. The other ends of the switches SW21, SW22, SW23, and SW24 are connected to the probe Pr2. The other ends of the switches SW31, SW32, SW33, and SW34 are connected to the probe Pr3. The other ends of the switches SW41, SW42, SW43, and SW44 are connected to the probe Pr4. The other ends of the switches SW51, SW52, SW53, and SW54 are connected to the probe Pr5. The other ends of the switches SW61, SW62, SW63, and SW64 are connected to the probe Pr6.

In an exemplary embodiment, preferably, a resistor for preventing a short circuit is provided between the probes Pr1 to Pr6 and the switches SW11 to SW64, but is not illustrated in the drawings.

The display part 20 illustrated in FIG. 4 corresponds to a display device such as a liquid crystal display device.

The control part 10 illustrated in FIG. 4 includes, for example, memory parts such as a CPU (Central Processing Unit) for executing predetermined arithmetic processing, a RAM (Random Access Memory) for temporarily storing data, and a ROM (Read Only Memory) or an HDD (Hard Disk Drive) for storing a predetermined control program, and peripheral circuits of these memory parts. The control part 10 executes the control program stored in the memory part, thereby functioning as a continuity inspection part 11, a low-voltage inspection part 12, a resistance measurement part 13, a high-voltage inspection part 14, and a failure cause estimation part 15.

The continuity inspection part 11 feeds a current between probes Pr for each wiring pattern P, thereby inspecting continuity of each wiring pattern. In an exemplary embodiment illustrated in FIG. 3, the probes Pr1 and Pr2 are provided for the wiring pattern P1, the probes Pr3 and Pr4 are provided for the wiring pattern P2, and the probes Pr5 and Pr6 are provided for the wiring pattern P3.

The low-voltage inspection part 12 conducts a low-voltage insulation inspection. Specifically, the low-voltage inspection part 12 causes a potential difference between the adjacent wiring patterns P1 and P2 defined as a wiring pattern pair P1-P2 among the wiring patterns P1, P2, and P3, and determines whether or not an insulation failure occurs between the wiring patterns P1 and P2 of the wiring pattern pair P1-P2, based on a current flowing between the wiring patterns P1 and P2 of the wiring pattern pair P1-P2. The low-voltage inspection part 12 also causes a potential difference between the adjacent wiring patterns P2 and P3 defined as a wiring pattern pair P2-P3 among the wiring patterns P1, P2, and P3, and determines whether or not an insulation failure occurs between the wiring patterns P2 and P3 of the wiring pattern pair P2-P3, based on a current flowing between the wiring patterns P2 and P3 of the wiring pattern pair P2-P3.

The resistance measurement part 13 executes a resistance measurement process. Specifically, the resistance measurement part 13 measures a resistance value between the wiring patterns of the wiring pattern pair determined in the low-voltage insulation inspection that the insulation failure occurs.

The high-voltage inspection part 14 conducts a high-voltage insulation inspection. Specifically, the high-voltage inspection part 14 causes a potential difference, which is larger than the potential difference caused in the low-voltage insulation inspection, between the wiring patterns of the different wiring pattern pair including one of the wiring patterns of the wiring pattern pair having the measured resistance value falling below a preset reference value Rref in the resistance measurement process, the different wiring pattern pair determined in the low-voltage insulation inspection that no insulation failure occurs, and determines whether or not an insulation failure occurs between the wiring patterns of the different wiring pattern pair, based on a current flowing between the wiring patterns of the different wiring pattern pair.

The failure cause estimation part 15 estimates a cause of an insulation failure, based on a result of the resistance measurement by the resistance measurement part 13, a result of the inspection by the low-voltage inspection part 12, and a result of the inspection by the high-voltage inspection part 14.

Figure 6:
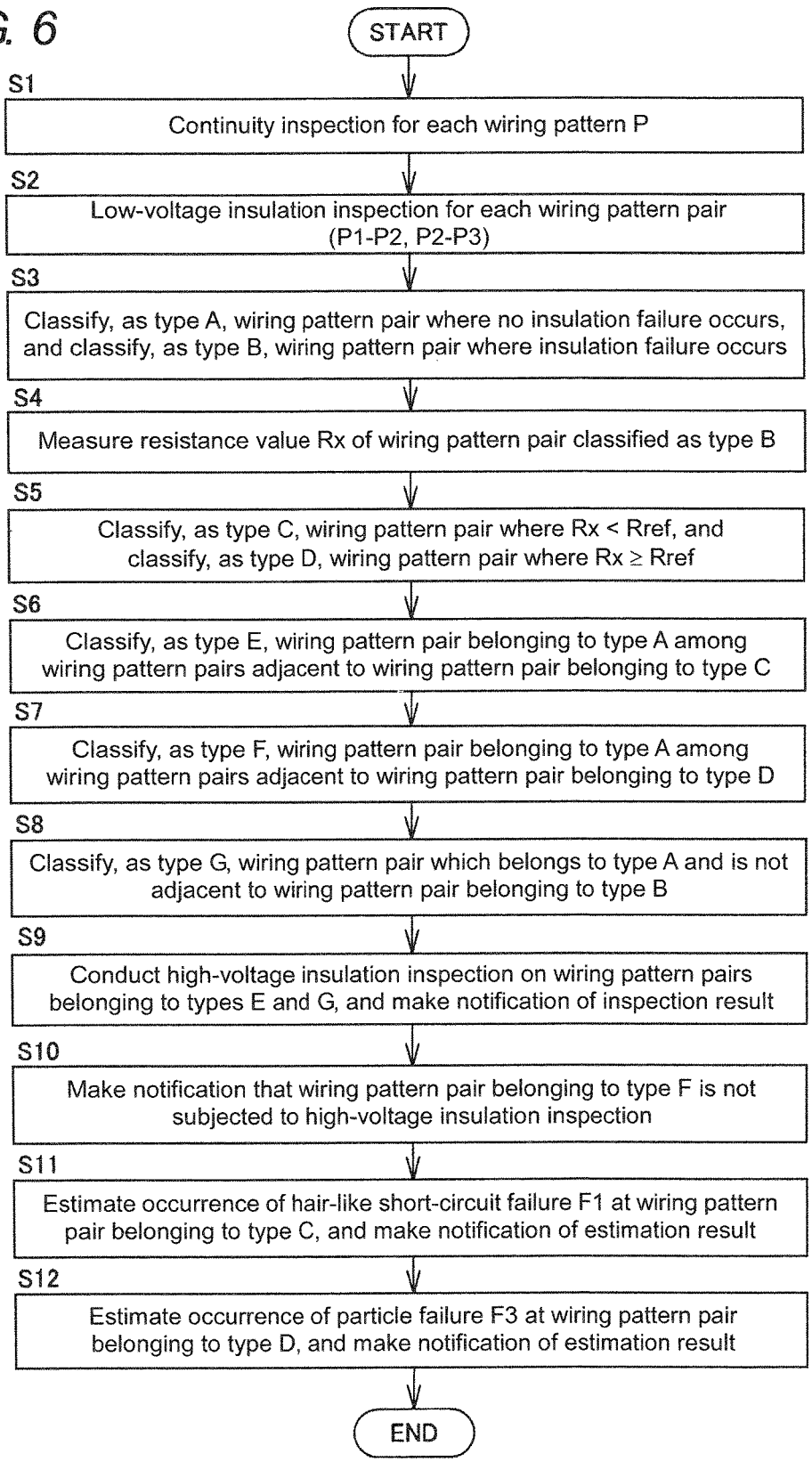
FIG. 6 is a flowchart illustrating operations of the circuit board inspecting apparatus that employs a circuit board inspecting method.
Figure 7:
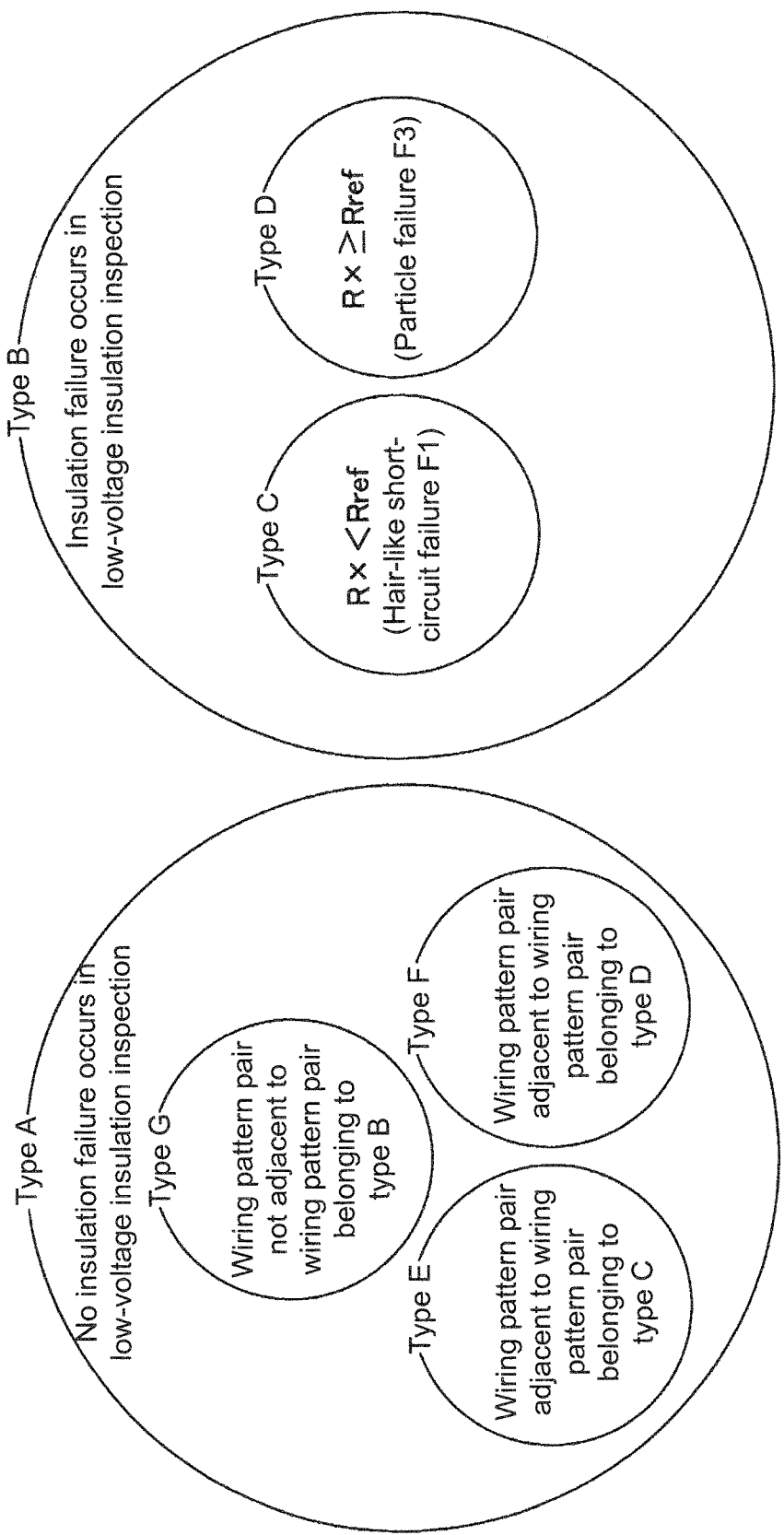
FIG. 7 illustrates the operations of the circuit board inspecting apparatus illustrated in FIGS. 3 and 4.

Next, a description will be given of operations of the circuit board inspecting apparatus 1 configured as described above. FIG. 6 is a flowchart illustrating the operations of the circuit board inspecting apparatus 1 that employs a circuit board inspecting method according to an exemplary embodiment of the disclosure. FIG. 7 illustrates the operations of the circuit board inspecting apparatus 1 illustrated in FIGS. 3 and 4. First, the continuity inspection part 11 conducts a continuity inspection on the wiring patterns P1, P2, and P3 (step S1).

It is assumed in the following description that all the switches SW are opened except for the switches SW described to be closed.

Upon conduction of the continuity inspection on the wiring pattern P1, specifically, the continuity inspection part 11 closes the switch SW11 to connect the power supply E to the probe Pr1. Moreover, the continuity inspection part 11 closes the switch SW22 and connects the terminal t0 to the terminal t2 in the changeover switch SW1, thereby connecting the probe Pr2 to the circuit ground via the current detection part 9. Further, the continuity inspection part 11 closes the switch SW13 to connect one end of the voltage detection part 8 to the probe Pr1, and closes the switch SW24 to connect the other end of the voltage detection part 8 to the probe Pr2.

Thus, the continuity inspection part 11 allows the power supply E to feed a predetermined current to the wiring pattern P1, allows the current detection part 9 to detect the current flowing through the wiring pattern P1, and allows the voltage detection part 8 to detect a voltage across the wiring pattern P1. The continuity inspection part 11 calculates a resistance value R1 of the wiring pattern P1 by dividing a value of the voltage detected by the voltage detection part 8 by a value of the current detected by the current detection part 9. The continuity inspection part 11 compares the resistance value R1 with a preset continuity determination value. When the resistance value R1 is not more than the continuity determination value, the continuity inspection part 11 determines that the wiring pattern P1 is electrically conductive (favorable). When the resistance value R1 is more than the continuity determination value, the continuity inspection part 11 determines that the wiring pattern P1 is disconnected (defective). The continuity inspection part 11 makes a notification of a result of the determination in such a manner that the display part 20 displays thereon the determination result.

The continuity inspection part 11 repeatedly executes the similar process on the wiring patterns P2 and P3, thereby conducting the continuity inspection on the wiring patterns P1, P2, and P3.

Next, the low-voltage inspection part 12 conducts a low-voltage insulation inspection on each wiring pattern pair (step S2: a low-voltage inspection step). Specifically, the low-voltage inspection part 12 conducts the low-voltage insulation inspection on the wiring pattern pair P1-P2 corresponding to the pair of wiring patterns P1 and P2, and the wiring pattern pair P2-P3 corresponding to the pair of wiring patterns P2 and P3.

Upon conduction of the low-voltage insulation inspection on the wiring pattern pair P1-P2, the low-voltage inspection part 12 closes the switch SW11 to connect the power supply E to the probe Pr1. Moreover, the low-voltage inspection part 12 closes the switch SW32 and connects the terminal t0 to the terminal t2 in the changeover switch SW1, thereby connecting the probe Pr3 to the circuit ground via the current detection part 9. Further, the low-voltage inspection part 12 closes the switches SW23 and SW44 to connect the voltage detection part 8 to the wiring pattern pair P1-P2. Thus, the low-voltage inspection part 12 allows the voltage detection part 8 to detect a voltage between the wiring patterns P1 and P2 via the probes Pr2 and Pr4. Moreover, the low-voltage inspection part 12 allows the power supply E to produce an output in the low-voltage mode.

When the voltage between the wiring patterns P1 and P2, which is detected by the voltage detection part 8, is not less than a determination voltage VLj set to be slightly lower than the low-voltage limit value VL, and when the current detected by the current detection part 9, that is, the current I1 flowing between the wiring patterns P1 and P2 is less than a preset determination current Ij, the low-voltage inspection part 12 determines that no insulation failure occurs at the wiring pattern pair P1-P2. On the other hand, when the current I1 is not less than the determination current Ij, the low-voltage inspection part 12 determines that an insulation failure occurs at the wiring pattern pair P1-P2.

The low-voltage inspection part 12 repeatedly executes the similar process on the wiring pattern pair P2-P3, thereby conducting the low-voltage insulation inspection on the wiring pattern pair P2-P3.

In the low-voltage insulation inspection, the power supply E applies a voltage and feeds a current in a state in which the occurrence of an insulation failure at the wiring pattern pair is not determined yet. In the low-voltage insulation inspection, however, the power supply E produces the output in the low-voltage mode. Therefore, even when the hair-like short-circuit failure F1 or the particle failure F3 occurs between the wiring patterns of the wiring pattern pair to be inspected, a portion where such a failure occurs is prevented from being burnt out.

Next, the low-voltage inspection part 12 classifies, as a type A, the wiring pattern pair determined that no insulation failure occurs in the low-voltage insulation inspection, and classifies, as a type B, the wiring pattern pair determined that an insulation failure occurs (step S3; see FIG. 7).

For example, when no insulation failure occurs between the wiring patterns P1 and P2 of the wiring pattern pair P1-P2 or when the narrow line failure F2 or the protrusion failure F4 occurs between the wiring patterns P1 and P2 of the wiring pattern pair P1-P2, no current flows between the wiring patterns P1 and P2 of the wiring pattern pair P1-P2 in the low-voltage insulation inspection. Therefore, the low-voltage inspection part 12 determines that no insulation failure occurs at the wiring pattern pair P1-P2, and classifies the wiring pattern pair P1-P2 as the type A. For example, the wiring pattern pair P2-P3 illustrated in FIG. 2A and the wiring pattern pair P2-P3 illustrated in FIG. 2B are classified as the type A.

On the other hand, when the hair-like short-circuit failure F1 or the particle failure F3 occurs between the wiring patterns P1 and P2 of the wiring pattern pair P1-P2, a current flows between the wiring patterns P1 and P2 of the wiring pattern pair P1-P2 in the low-voltage insulation inspection.

Thus, the low-voltage inspection part 12 determines that the insulation failure occurs at the wiring pattern pair P1-P2, and classifies the wiring pattern pair P1-P2 as the type B.

Next, the resistance measurement part 13 measures a resistance value Rx between the wiring patterns of the wiring pattern pair classified as the type B (step S4: a resistance measurement step). Specifically, when the wiring pattern pair P1-P2 is classified as the type B, the resistance measurement part 13 closes the switch SW11 to connect the power supply E to the probe Pr1. Moreover, the resistance measurement part 13 closes the switch SW32 and connects the terminal t0 to the terminal t2 in the changeover switch SW1, thereby connecting the probe Pr3 to the circuit ground via the current detection part 9. Thus, the resistance measurement part 13 allows the current detection part 9 to detect a current flowing between the wiring patterns P1 and P2 (the resistance value Rx).

Moreover, the resistance measurement part 13 closes the switches SW23 and SW44 to connect the voltage detection part 8 to the wiring pattern pair P1-P2. Thus, the resistance measurement part 13 allows the voltage detection part 8 to detect a voltage between the wiring patterns P1 and P2. Further, the resistance measurement part 13 allows the power supply E to produce an output in, for example, the low-voltage mode.

The resistance measurement part 13 calculates the resistance value Rx between the wiring patterns P1 and P2 by dividing a value of the voltage detected by the voltage detection part 8 by a value of the current detected by the current detection part 9.

The current fed from the power supply E flows into the circuit ground via the switch SW11, the probe Pr1, the portion where the insulation failure occurs (the resistance value Rx), the probe Pr3, the switch SW32, the changeover switch SW1, and the current detection part 9. On the other hand, the voltage detection part 8 detects a voltage generated by the current flowing through the portion where the insulation failure occurs, using a voltage measurement route extending from one end to the other end of the voltage detection part 8 via the switch SW23, the probe Pr2, the portion where the insulation failure occurs (the resistance value Rx), the probe Pr4, and the switch SW44.

In this case, the current fed from the power supply E flows through only the portion where the insulation failure occurs (the resistance value Rx), in the voltage measurement route of the voltage detection part 8. Therefore, the voltage, which is generated when the current fed from the power supply E flows through the voltage detection circuit including the probes Pr2 and Pr4, is excluded from the voltage detected by the voltage detection part 8. That is, the resistance measurement part 13 is capable of more accurately measuring the resistance value Rx of the portion where the insulation failure occurs, by a four-terminal measurement method.

The four probes Pr1 to Pr4 for use in the four-terminal measurement method correspond to the probes used for conducting the continuity inspection on the wiring patterns P1 and P2 in step S1. In other words, the probes used for conducting the continuity inspection on the wiring patterns P1 and P2 can be used for the four-terminal measurement method, without adding probes for the four-terminal measurement method. Therefore, the resistance measurement part 13 is capable of accurately measuring the resistance value Rx of the portion where the insulation failure occurs, without increasing cost.

Next, the resistance measurement part 13 compares the measured resistance value Rx with a reference value Rref. Then the reference measurement part 13 classifies, as a type C, the wiring pattern pair having the resistance value Rx which is less than the reference value Rref, and classifies, as a type D, the wiring pattern pair having the resistance value Rx which is not less than the reference value Rref (step S5; see FIG. 7).

The reference value Rref is set at a value which is obtained by experiment and is capable of distinguishing the resistance value of the portion where the hair-like short-circuit failure F1 occurs from the resistance value of the portion where the particle failure F3 occurs. The reference value Rref may be set at, for example, substantially 25Ω.

In this case, there is a high possibility that the hair-like short-circuit failure F1 occurs at the wiring pattern pair classified as the type C. On the other hand, there is a high possibility that the particle failure F3 occurs at the wiring pattern pair classified as the type D. For example, the wiring pattern pair P1-P2 illustrated in FIG. 2A is classified as the type C, and the wiring pattern pair P1-P2 illustrated in FIG. 2B is classified as the type D.

Next, the high-voltage inspection part 14 classifies the wiring pattern pair belonging to the type A, as a type E, among the wiring pattern pairs adjacent to the wiring pattern pair belonging to the type C (step S6; see FIG. 7). For example, when the wiring pattern pair P1-P2 is classified as the type C, the high-voltage inspection part 14 determines whether or not the wiring pattern pair P2-P3 adjacent to the wiring pattern pair P1-P2 belongs to the type A. When the wiring pattern pair P2-P3 belongs to the type A, the high-voltage inspection part 14 classifies the wiring pattern pair P2-P3 as the type E. Herein, a wiring pattern pair including one of wiring patterns of a certain wiring pattern pair will be referred to as a wiring pattern pair adjacent to the certain wiring pattern pair.

Next, the high-voltage inspection part 14 classifies the wiring pattern pair belonging to the type A, as a type F, among the wiring pattern pairs adjacent to the wiring pattern pair belonging to the type D (step S7; see FIG. 7). For example, when the wiring pattern pair P1-P2 is classified as the type D, the high-voltage inspection part 14 determines whether or not the wiring pattern pair P2-P3 adjacent to the wiring pattern pair P1-P2 belongs to the type A. When the wiring pattern pair P2-P3 belongs to the type A, the high-voltage inspection part 14 classifies the wiring pattern pair P2-P3 as the type F.

Next, the high-voltage inspection part 14 classifies, as a type G, the wiring pattern pair which belongs to the type A and is not adjacent to the wiring pattern pair belonging to the type B (step S8).

Next, the high-voltage inspection part 14 conducts a high-voltage insulation inspection on each of the wiring pattern pair belonging to the type E and the wiring pattern pair belonging to the type G to determine whether or not an insulation failure occurs at each wiring pattern pair. The failure cause estimation part 15 estimates the occurrence of the narrow line failure F2 or protrusion failure F4 at the wiring pattern pair determined in the high-voltage insulation inspection that an insulation failure occurs, and then makes a notification of a result of the estimation in such a manner that the display part 20 displays thereon the estimation result (step S9: high-voltage inspection step).

Specifically, when the wiring pattern pair P2-P3 belongs to the type E, the high-voltage inspection part 14 closes the switch SW31 to connect the power supply E to the probe Pr3, in order to conduct the high-voltage insulation inspection on the wiring pattern pair P2-P3. Moreover, the high-voltage inspection part 14 closes the switch SW52 and connects the terminal t0 to the terminal t2 in the changeover switch SW1, thereby connecting the probe Pr5 to the circuit ground via the current detection part 9. Further, the high-voltage inspection part 14 closes the switches SW43 and SW64 to connect the voltage detection part 8 to the wiring pattern pair P2-P3. Thus, the high-voltage inspection part 14 allows the voltage detection part 8 to detect a voltage between the wiring patterns P2 and P3. Then the high-voltage inspection part 14 allows the power supply E to produce an output in the high-voltage mode.

For example, when the voltage between the wiring patterns P2 and P3, which is detected by the voltage detection part 8, is not less than the determination voltage VHj set to be slightly lower than the high-voltage limit value VH and when the current detected by the current detection part 9, that is, the current I2 flowing between the wiring patterns P2 and P3 is less than the determination current Ij, the high-voltage inspection part 14 determines that no insulation failure occurs at the wiring pattern pair P2-P3. When the current I2 is not less than the determination current Ij, the high-voltage inspection part 14 determines that an insulation failure (the narrow line failure F2 or the protrusion failure F4) occurs at the wiring pattern pair P2-P3.

In the high-voltage insulation inspection, the high-voltage inspection part 14 detects an insulation failure by detecting a discharge current which flows by sparking occurring in such a manner that a high voltage is applied to the portion where the narrow line failure F2 or the protrusion failure F4 occurs. The sparking occurs immediately after the application of a high voltage. Therefore, the high-voltage inspection part 14 determines whether or not an insulation failure occurs, based on a detection value of the current I2 which transiently flows immediately after application of a voltage to the wiring pattern pair to be inspected.

The hair-like short-circuit failure F1 or the particle failure F3 potentially occurs at the wiring pattern pair which belongs to the type B and is determined in the low-voltage insulation inspection that an insulation failure occurs. Therefore, when the high-voltage insulation inspection is conducted on the wiring pattern pair, the circuit board 100 is potentially burnt out. In step S8, however, each of the wiring pattern pair belonging to the type E and the wiring pattern pair belonging to the type F among the wiring pattern pairs belonging to the type A is selected as a target to be subjected to the high-voltage insulation inspection. Therefore, the high-voltage insulation inspection is not conducted on the wiring pattern pair belonging to the type B. This result reduces a risk of burnout of the circuit board 100 in the high-voltage insulation inspection.

The high-voltage inspection part 14 does not conduct the high-voltage insulation inspection (i.e., prohibits the conduction of the high-voltage insulation inspection) on the wiring pattern pair belonging to the type F, that is, the wiring pattern pair having a possibility that the particle failure F3 occurs at the adjacent wiring pattern pair, such as the wiring pattern pair P2-P3 illustrated in FIG. 2B, among the wiring pattern pairs belonging to the type A.

The inventors have found the following fact. The particle failure F3 occurring between the wiring patterns P1 and P2 causes capacitive coupling between the wiring patterns P1 and P2, as described above. For this reason, in the case where the particle failure F3 occurs at the adjacent wiring pattern pair P1-P2 like the wiring pattern pair P2-P3 illustrated in FIG. 2B, when a high voltage is applied to the wiring pattern pair P2-P3 in the high-voltage insulation inspection, the high voltage applied to the wiring pattern P2 is transiently absorbed by the capacitive coupling. As a result, even when the protrusion failure F4 or the narrow line failure F2 occurs at the wiring pattern pair P2-P3, no sparking occurs at the portion where the insulation failure occurs.

The inventors have found the following fact. When the wiring pattern pair belonging to the type F is subjected to the high-voltage insulation inspection, no sparking occurs at the portion where the insulation failure occurs. Consequently, it is impossible to detect the insulation failure such as the protrusion failure F4 or the narrow line failure F2.

For this reason, the high-voltage inspection part 14 does not conduct the high-voltage insulation inspection on the wiring pattern pair belonging to the type F. Thus, it is possible to reduce the possibility that the insulation failure is erroneously detected, and it is possible to improve the accuracy of the insulation inspection.

With regard to the wiring pattern pair belonging to the type G, it is considered that the hair-like short-circuit failure F1 or the particle failure F3 does not occur at the wiring pattern pairs adjacent to both the sides of the wiring pattern pair belonging to the type G. Therefore, there is no possibility that the accuracy of the insulation inspection is degraded because of an influence of the adjacent wiring pattern pair. For this reason, the high-voltage inspection part 14 conducts the high-voltage insulation inspection on the wiring pattern pair belonging to the type G, and then makes a notification of a result of the inspection.

With regard to the wiring pattern pair belonging to the type E, such as the wiring pattern pair P2-P3 illustrated in FIG. 2A, the hair-like short-circuit failure F1 occurs at the adjacent wiring pattern pair P1-P2, that is, the adjacent wiring pattern pair P1-P2 belongs to the type C. In an exemplary embodiment illustrated in FIG. 3, when the high-voltage insulation inspection is conducted on the wiring pattern pair P2-P3 in the state in which the hair-like short-circuit failure F1 occurs at the wiring pattern pair P1-P2, the switches SW11 to SW14 and SW21 to SW24 connected to the probes Pr1 and Pr2 are opened. Therefore, the adjacent wiring pattern pair P1-P2 is in a floating state. As a result, the wiring pattern P2 and the wiring pattern P1 are short-circuited by the hair-like short-circuit failure F1, and are made to be equal in potential to each other.

Accordingly, even when a high voltage is applied between the wiring patterns P2 and P3 of the wiring pattern pair P2-P3, a transient voltage is not absorbed. If the narrow line failure F2 or the protrusion failure F4 occurs between the wiring patterns P2 and P3 of the wiring pattern pair P2-P3, the insulation failure can be detected because of the occurrence of sparking. For this reason, the high-voltage inspection part 14 conducts the high-voltage insulation inspection on the wiring pattern pair belonging to the type E, and then makes a notification of a result of the inspection. Thus, it is possible to conduct the high-voltage insulation inspection on not only the wiring pattern pair belonging to the type G, that is, the wiring pattern pair revealed that the accuracy of the high-voltage insulation inspection is not degraded, but also the wiring pattern pair belonging to the type E, that is, the wiring pattern pair adjacent to the wiring pattern pair at which an insulation failure occurs. Therefore, it is possible to improve the accuracy of the insulation inspection.

The wiring pattern pairs belonging to the type A, that is, the wiring pattern pairs to be subjected to the high-voltage insulation inspection include a non-defective wiring pattern pair at which no insulation failure occurs and a defective wiring pattern pair at which the narrow line failure F2 or the protrusion failure F4 occurs. Accordingly, it is considered that the narrow line failure F2 or the protrusion failure F4 occurs at the wiring pattern pair determined in the high-voltage insulation inspection that an insulation failure occurs. The failure cause estimation part 15 estimates occurrence of the narrow line failure F2 or the protrusion failure F4 at the wiring pattern pair determined in the high-voltage insulation inspection that an insulation failure occurs, and then makes a notification of a result of the estimation in such a manner that the display part 20 displays thereon the estimation result (step S9).

Next, the high-voltage inspection part 14 makes a notification of such a message that the high-voltage insulation inspection is not conducted on the wiring pattern pair belonging to the type F, in such a manner that the display part 20 displays this message thereon (step S10). This notification can inform a user that the narrow line failure F2 or the protrusion failure F4 potentially occurs at the wiring pattern pair belonging to the type F.

Next, the failure cause estimation part 15 estimates occurrence of the hair-like short-circuit failure F1 at the wiring pattern pair belonging to the type C, and then makes a notification of a result of the estimation in such a manner that the display part 20 displays thereon the estimation result (step S11). This notification can inform the user that the hair-like short-circuit failure F1 potentially occurs at the wiring pattern pair belonging to the type C.

Next, the failure cause estimation part 15 estimates occurrence of the particle failure F3 at the wiring pattern pair belonging to the type D, and then makes a notification of a result of the estimation in such a manner that the display part 20 displays thereon the estimation result (step S12). This notification can inform the user that the particle failure F3 potentially occurs at the wiring pattern pair belonging to the type D.

In an illustrative embodiment, the resistance measurement part 13 performs resistance measurement by the four-terminal measurement method using the probes Pr1 and Pr3 for feeding a current and the probes Pr2 and Pr4 for detecting a voltage. Alternatively, the resistance measurement part 13 may perform the resistance measurement by a two-terminal measurement method using probes commonly used for feeding a current and detecting a voltage. Moreover, the circuit board inspecting apparatus 1 does not necessarily include the continuity inspection part 11, and may be configured such that the probes are brought into contact with the wiring patterns, respectively.

In an illustrative embodiment, the high-voltage inspection part 14 does not conduct the high-voltage insulation inspection on the wiring pattern pair belonging to the type F. Alternatively, the high-voltage inspection part 14 may conduct the high-voltage insulation inspection on the wiring pattern pair belonging to the type F. In step S10, the high-voltage inspection part 14 may make such a notification that the result of determination about the wiring pattern pair belonging to the type F in the high-voltage insulation inspection is low in reliability.

In an illustrative embodiment, the switches SW11 to SW64 are opened except for the switches connected to the probes to be brought into contact with the wiring pattern pair to be inspected. Alternatively, the respective switches may be controlled as follows. If the wiring pattern pair to be inspected belongs to the type E, the switch to be opened is connected to the probe to be brought into contact with the wiring pattern which is adjacent to the wiring pattern pair to be inspected and is included in the wiring pattern pair belonging to the type C. Moreover, the remaining probes other than the relevant probe and the probes brought into contact with the wiring pattern pair to be inspected are connected to the circuit ground.

In an illustrative embodiment, the reference value Rref is set to be capable of distinguishing the resistance value of the portion where the hair-like short-circuit failure F1 occurs from the resistance value of the portion where the particle failure F3 occurs. However, the reference value Rref is not necessarily limited to this example. The reference value Rref is not particularly limited so long as it is capable of distinguishing a failure that causes capacitive coupling absorbing sparking at a portion where an insulation failure occurs (e.g., the type D) from the remaining failures (e.g., the type C). The insulation failure occurring at the wiring pattern pair belonging to the type D is not limited to the particle failure F3 so long as it causes capacitive coupling which absorbs sparking at a portion where an insulation failure occurs. Moreover, the insulation failure occurring at the wiring pattern pair belonging to the type C is not limited to the hair-like short-circuit failure F1 so long as it does not cause capacitive coupling which absorbs sparking at a portion where an insulation failure occurs.

The foregoing disclosure has been specifically described and illustrated in connection with certain illustrative embodiments. However, it is clearly understood that the embodiments are by way of illustration and example only and are not to be taken by way of limitation. The spirit and scope of the invention are limited only by the terms of the appended claims.

What is claimed is:

1. A circuit board inspecting apparatus for inspecting a circuit board having wiring patterns separated from each other and forming a plurality of wiring pattern pairs, the circuit board inspecting apparatus comprising:
   a low-voltage inspection part configured to:
      apply a first low-potential difference below a threshold voltage between wiring patterns in a first of said plurality of wiring pattern pairs, and
      detect a first current flowing therebetween;
   a resistance measurement part configured to measure a first resistance value between the wiring patterns of the first of said plurality of wiring pattern pairs upon detection of said first current; and
   a high-voltage inspection part configured to selectively apply, based on the first resistance value, a high-potential difference above said threshold voltage, between the wiring patterns in a second of said plurality of wiring pattern pairs.

2. The circuit board inspecting apparatus of claim 1 wherein the second of said plurality of wiring pattern pairs shares one wiring pattern with the first of said plurality of wiring pattern pairs.

3. The circuit board inspecting apparatus of claim 2 wherein the low-voltage inspection part is further configured to:
   apply a second low-potential difference below the threshold voltage between the wiring patterns in the second of said plurality of wiring pattern pairs, and
   detect a second current flowing therebetween.

4. The circuit board inspecting apparatus of claim 3 wherein the high-voltage inspection part is configured to detect a third current flowing between the wiring patterns of the second of said plurality of wiring pattern pairs upon application of the high-potential difference thereto.

5. The circuit board inspecting apparatus of claim 4 wherein detection of the first current indicates an insulation failure in the first of said plurality of wiring pattern pairs and wherein detection of one of the second current and/or the third current indicates an insulation failure in the second of said plurality of wiring pattern pairs.

6. The circuit board inspecting apparatus of claim 5 wherein the high-voltage inspection part does not apply the high-potential difference between the wiring patterns of the second of said plurality of wiring pattern pairs where the first resistance value exceeds a reference value.

7. The circuit board inspecting apparatus of claim 5 wherein the high-voltage inspection part does not apply the high-potential difference between the wiring patterns of the second of said plurality of wiring pattern pairs if the second current is detected.

8. The circuit board inspecting apparatus of claim 5 further comprising:
a first probe set having a first and second probe configured to be brought into contact respectively with a first and second contact of a first wiring pattern of the first of said plurality of wiring pattern pairs, and
a second probe set having a first and second probe configured to be brought into contact respectively with a first and second contact of a second wiring pattern of the first of said plurality of wiring pattern pairs,
wherein the resistance measurement part detects a first voltage between the respective second probes due to a current applied to the first and second wiring pattern at the respective first probes, the resistance value being calculated based on the detected voltage.

9. The circuit board inspecting apparatus of claim 5 wherein the threshold voltage is a voltage causing no burnout due to said insulation failure, wherein the insulation failure is caused by a linear conductor formed to connect between adjacent wiring patterns and/or a failure caused by a plurality of conductor particles distributed between the adjacent wiring patterns.

10. The circuit board inspecting apparatus of claim 5, wherein the first and/or second low-potential difference is the lower of:
a voltage generated when the respective first and/or second current is between a predetermined current of 0.1 mA to 2 mA, and
a predetermined voltage between 0.2 V to 20V.

11. The circuit board inspecting apparatus of claim 5, wherein the insulation failure narrows a length between the wiring patterns of the first and/or second of said plurality of wiring pattern pairs and the high-potential difference is set at a voltage sufficient to cause sparking between the wiring patterns due to said insulation failure.

12. The circuit board inspecting apparatus of claim 11, wherein the high-potential difference is set at the lower of:
a voltage generated when the third current exceeds 2 mA, and
a predetermined voltage exceeding 20 V.

13. The circuit board inspecting apparatus of claim 6, wherein the reference value is set to distinguish a failure portion corresponding to a linear conductor formed to connect between adjacent wiring patterns, from a failure portion corresponding to a plurality of conductor particles distributed between the adjacent wiring patterns.

14. The circuit board inspecting apparatus of claim 13, wherein the reference value is substantially 25 Ohms.

15. The circuit board inspecting apparatus of claim 13, further comprising:
a failure cause estimation part configured to determine the insulation failure is caused by a linear conductor formed to connect between the wiring patterns of the first of said plurality of wiring pattern pairs when the first resistance value is below the reference value.

16. The circuit board inspecting apparatus of claim 13 further comprising:
a failure cause estimation part configured to determine the insulation failure is caused by a plurality of conductor particles distributed between the wiring patterns of the first of said plurality of wiring pattern pairs when the first resistance value exceeds the reference value.

17. The circuit board inspecting apparatus of claim 16 further comprising:
a failure cause estimation part configured to determine the insulation failure is caused by a failure portion formed to narrow a length between the wiring patterns of the second of said plurality of wiring pattern pairs when the third current indicates an insulation failure in the second of said plurality of wiring pattern pairs.

18. A circuit board inspecting method for inspecting insulation among three or more wiring patterns disposed on a circuit board so as to be spaced apart from one another such that adjacent wiring patterns form a plurality of wiring pattern pairs, the circuit board inspecting method comprising:
conducting a low-voltage insulation inspection comprising:
causing a low-potential difference below a threshold voltage between adjacent wiring patterns in a first wiring pattern pair of said plurality of wiring pattern pairs;
determining whether an insulation failure exists between the wiring patterns of the first wiring pattern pair, based on current flowing between the wiring patterns thereof;
causing a low-potential difference below a threshold voltage between adjacent wiring patterns in a second wiring pattern pair of said plurality of wiring pattern pairs; and
determining whether an insulation failure exists between the wiring patterns of the second wiring pattern pair, based on current flowing between the wiring patterns thereof;
measuring a resistance value between the wiring patterns of the first wiring pattern pair in which an insulation failure is determined; and
conducting a high-voltage insulation inspection comprising:
selectively causing a high-potential difference above a threshold voltage between the wiring patterns of the second wiring pattern pair based on the measured resistance value, and
determining whether an insulation failure exists between the wiring patterns of the second wiring pattern pair based on a current flowing therebetween.

19. The method of claim 18, wherein the high-potential difference is selectively caused where:
1) no insulation failure was detected in the second wiring pattern pair during low-voltage insulation inspection thereof,
2) an insulation failure was detected in the first wiring pattern pair during low-voltage insulation inspection thereof; and
3) the measured resistance value does not exceed a threshold value.

20. The method of claim 19 wherein the high-potential difference is selectively prohibited where:
1) the second wiring pattern pair shares at least one wiring pattern with the first wiring pattern pair;
2) an insulation failure was detected in the first wiring patter pair during low-voltage insulation inspection thereof; and 3) the measured resistance value exceeds a threshold value.

* * * * *